US010613569B2

(12) United States Patent
Wang et al.

(10) Patent No.: US 10,613,569 B2
(45) Date of Patent: Apr. 7, 2020

(54) LOW POWER HALF-VDD GENERATION CIRCUIT WITH HIGH DRIVING CAPABILITY

(71) Applicant: Analog Devices Global Unlimited Company, Hamilton (BM)

(72) Inventors: Hanqing Wang, Beijing (CN); Gerard Mora-Puchalt, Catarroja (ES)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/951,894

(22) Filed: Apr. 12, 2018

(65) Prior Publication Data
US 2019/0317541 A1 Oct. 17, 2019

(51) Int. Cl.
*H02M 3/16* (2006.01)
*G05F 3/16* (2006.01)
*H03K 17/687* (2006.01)
*H03F 3/45* (2006.01)
*H03F 3/00* (2006.01)

(52) U.S. Cl.
CPC ............... *G05F 3/16* (2013.01); *H03F 3/005* (2013.01); *H03F 3/45475* (2013.01); *H03K 17/687* (2013.01); *H03F 2200/129* (2013.01); *H03F 2203/45512* (2013.01); *H03F 2203/45551* (2013.01)

(58) Field of Classification Search
CPC ... G05F 3/20; G05F 3/227; G05F 3/24; G05F 3/242; H03F 3/005; H03F 3/45475; H03F 2203/45512; H03F 2200/129; H03F 2203/45551; H03K 17/687

USPC .................................................. 323/313, 315
See application file for complete search history.

(56) References Cited

U.S. PATENT DOCUMENTS

| 4,804,865 | A | * | 2/1989 | Clark, II ................... G05F 3/24 |
| | | | | 136/293 |
| 4,933,644 | A | | 6/1990 | Fattaruso et al. |
| 5,610,550 | A | * | 3/1997 | Furutani ............ H01L 27/0218 |
| | | | | 257/371 |
| 5,729,178 | A | | 3/1998 | Park et al. |
| 6,118,265 | A | * | 9/2000 | Larsen .................... G05F 1/467 |
| | | | | 323/316 |
| 6,351,178 | B1 | * | 2/2002 | Ooishi ..................... G11C 5/143 |
| | | | | 323/313 |
| 6,486,820 | B1 | * | 11/2002 | Allworth ............... H03F 1/0277 |
| | | | | 341/155 |
| 7,295,042 | B2 | | 11/2007 | Hatanaka |
| 7,405,625 | B1 | | 7/2008 | Hensley et al. |
| 9,813,056 | B2 | | 11/2017 | Shao et al. |
| 2001/0007418 | A1 | | 7/2001 | Komatsu et al. |

(Continued)

*Primary Examiner* — Alex Torres-Rivera
(74) *Attorney, Agent, or Firm* — Schwegman Lundberg & Woessner, P.A.

(57) ABSTRACT

A common mode reference circuit comprises a divider stage and an output stage. The divider stage includes a first n-channel field effect transistor and p-channel filed effect transistor (NFET/PFET) pair connected in series to a high supply voltage circuit node; and a second NFET/PFET pair connected in series to a low supply voltage circuit node. The output stage includes a first FET connected as a current mirror to a transistor of the first NFET/PFET pair; a second FET connected as a current mirror to a transistor of the second NFET/PFET pair; and a common mode reference output at a series connection from the first FET to the second FET.

21 Claims, 13 Drawing Sheets

(56) References Cited

U.S. PATENT DOCUMENTS

| | | | | |
|---|---|---|---|---|
| 2002/0024382 A1* | 2/2002 | Kwan | ............... | H03F 3/005 |
| | | | | 330/9 |
| 2003/0052661 A1* | 3/2003 | Tachimori | ............... | G05F 3/242 |
| | | | | 323/313 |
| 2006/0202721 A1* | 9/2006 | Partow | ............... | H03F 3/45183 |
| | | | | 327/65 |
| 2011/0274290 A1 | 11/2011 | Holzmann et al. | | |
| 2016/0013765 A1* | 1/2016 | Peluso | ............... | H03F 3/005 |
| | | | | 330/260 |

\* cited by examiner

LOW POWER HALF-VDD GENERATION CIRCUIT WITH HIGH DRIVING CAPABILITY

FIELD OF THE DISCLOSURE

This document relates to electronic circuits and in particular to circuits that provide a voltage reference to an electronic circuit system.

BACKGROUND

In differential electronic circuits (e.g., analog-to-digital converter (ADC) circuits, integrator circuits, programmable gain amplifiers, etc.), a common mode voltage is typically set to midway between the high power supply rail and the low power supply rail to achieve maximum dynamic range on the input and output of the circuits.

SUMMARY OF THE DISCLOSURE

FIG. 1 is a circuit diagram of an example of an approach to a common mode reference circuit. Resistors R1 and R2 divide the voltage VDD of the high supply rail. If the resistors are chosen so that R1=R0, the common mode voltage will be one half of VDD or VDD/2. A unity gain buffer is used to enhance the drive ability. In an ultralow power application, such as an application in which VDD is 1.8 volts (VDD=1.8V) and it is desired to limit the current through the resistors to 100 nano-amperes (100 nA), the total resistance would be at least 18 mega-ohms (18 MΩ), which occupies a very large area. Another disadvantage of the circuit approach in FIG. 1 is that the buffer typically consumes much more current than the voltage divider leg that generates the common mode voltage reference. Circuit stability for different capacitive loads also needs to be considered. The present inventors have recognized a need for improved performance of common mode reference circuits.

This document relates generally to integrated circuits, and in particular to circuits that can be used to generate a common mode reference, such as for by other, differential, circuits. In some aspects, a common mode reference circuit can comprise a divider stage and an output stage. The divider stage can include a first n-channel field effect transistor and p-channel field effect transistor (NFET/PFET) pair connected in series to a high supply voltage circuit node; and a second NFET/PFET pair connected in series to a low supply voltage circuit node. The output stage includes a first field effect transistor (FET) connected as a current mirror to a transistor of the first NFET/PFET pair; a second FET connected as a current mirror to a transistor of the second NFET/PFET pair; and a common mode reference output at a series connection from the first output stage FET to the second output stage FET.

In some aspects, an electronic circuit can comprise a common mode reference circuit. The common mode reference circuit can include a divider stage that can include: a first transistor pair connected in series to a high supply voltage circuit node; a second transistor pair connected in series to the first transistor pair and a low supply voltage circuit node; a third transistor pair connected in series to the high supply voltage circuit node; and a fourth transistor pair connected in series to the third transistor pair and the low supply voltage circuit node. The common mode reference circuit also can include a push-pull output stage connected to the first and second divider stages and can include a common mode reference output.

In some aspects, an electronic circuit can comprise a common mode reference circuit and an analog-to-digital converter (ADC) circuit. The common mode reference circuit can include a divider stage and an output stage. The divider stage can include a first NFET/PFET pair connected in series to a high supply voltage circuit node; and a second NFET/PFET pair connected in series to a low supply voltage circuit node. The output stage can include a first FET connected as a current mirror to a transistor of the first NFET/PFET pair; a second FET connected as a current mirror to a transistor of the second NFET/PFET pair; and a common mode reference output at a series connection from the first FET of the output stage to the second FET of the output stage. The ADC circuit can include a first digital-to-analog converter (DAC) circuit and a second DAC circuit that each include weighted bit capacitors; and a sampling circuit configured to sample a differential input voltage onto the weighted bit capacitors with respect to a voltage of the common mode reference output.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document relates to electronic circuits that generate a common mode reference. The circuits are power efficient and take up a small amount of circuit area, yet the circuits have a fast response time. The circuits can also drive switched capacitor circuits without circuit stability problems. This makes the circuits very desirable for ultralow power designs.

Figure 2:
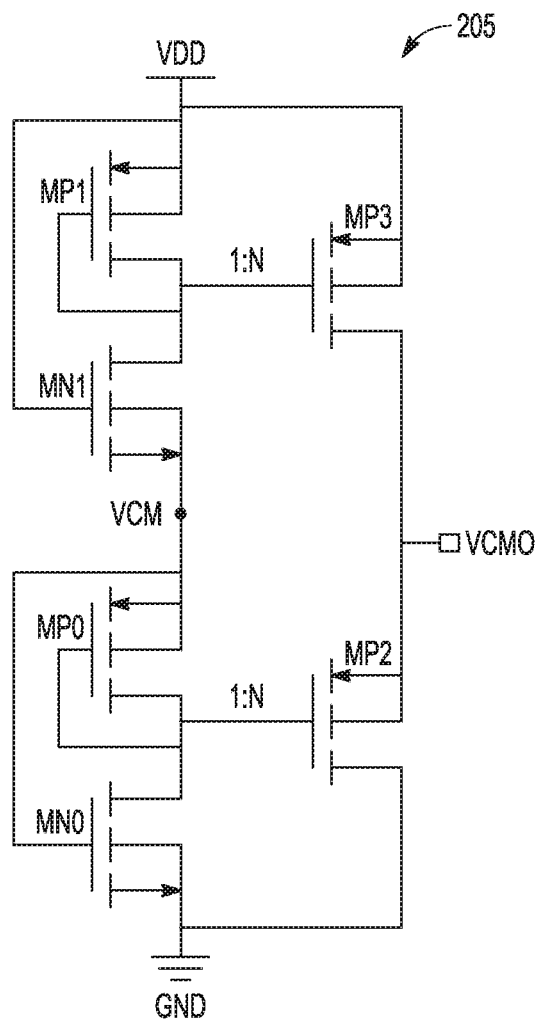
FIG. 2 is a circuit diagram of a common mode reference circuit in another aspect.

FIG. 2 is a circuit diagram of an example of a common mode reference circuit 205. The circuit includes a divider stage that generates the common mode voltage (VCM) and an output stage to provide drive to a circuit load. In FIG. 2, the circuit includes n-channel field effect transistors (NFETs) and p-channel field effect transistors (PFETs). The FETs can be metal oxide semiconductor field effect transistors (MOSFETS) or MOS transistors (e.g., NMOS and PINTOS transistors).

The divider stage includes two NFET/PFET pairs that divide the high supply voltage rail VDD. The first NFET/PFET pair includes PFET MP1 connected in series with NFET MN1 connected in series to the high supply voltage rail. The second NFET/PFET pair includes PFET MP0 and NFET MN0 connected in series with the low voltage supply rail (e.g., ground). Transistor MN0 is matched in width (W) and length (L) to transistor MN1, and transistor MP0 is matched in width (W) and length (L) to transistor MP1, or $$W_{MN0}=W_{MN1}, L_{MN0}=L_{MN1}$$

$$W_{MP0}=W_{MP1}, L_{MP0}=L_{MP1}.$$

Transistors MN1 and MN0 are long devices (e.g., long relative to p-channel devices MP1 and MP0), and the transistors MP1 and MP0 are wide devices (e.g., wide relative to n-channel devices MN1 and MN0), so that $$(w/L)_{MN0/1} << (W/L)_{MP0/1}.$$

This leads to the gate source voltages (Vgs) of the NFETs being greater a the gate source voltages of the PFETs, or $$Vgs_{MN0}=Vgs_{MN1}>Vgs_{MP0}=Vgs_{MP1}.$$

All the transistors are biased to the saturation region. The difference between the high supply voltage and the low supply voltage is divided by the two transistor pairs. The current in the divider stage is determined by the long n-channel devices MN1 and MN0. The voltage at the node between MN1 and MP0 is the common mode voltage (VCM).

The output stage comprises PFETs MP2 and MP3. The gate region of MN0 is connected to the source region of MP0. The gate region of MN1 is connected to the source region of MP1. The gate and drain regions of MP0 are connected together and the gate region of MP2 is connected to the gate region of MP0. In this way, MP2 is connected as a mirror device to mirror the current of MP0. Similarly, MP3 is connected as a mirror device to mirror the current in MP1. The current mirrors of the output stage mirror N times the current in transistor of the divider stage, or $$(W/L)_{MP2/3}:(W/L)_{MP0/1}=N$$

(where N is a positive number greater than or equal to 1), so that the current in the output stage is N times the current of the divider stage. The common mode reference output (VCMO) is at a circuit node that is series connection from the MP3 transistor to the MP2 transistor. The common mode reference output (VCMO) is equal to the common reference (VCM).

Because the source terminal of MP2 is connected to VCMO, it has a strong ability to sink current. However, the current sourcing ability of transistor MP3 is weak. If there is an overshoot disturbance from a capacitive load, the output stage can recover quickly. If there is downshoot disturbance, the output stage is slow to recover.

Figure 3:
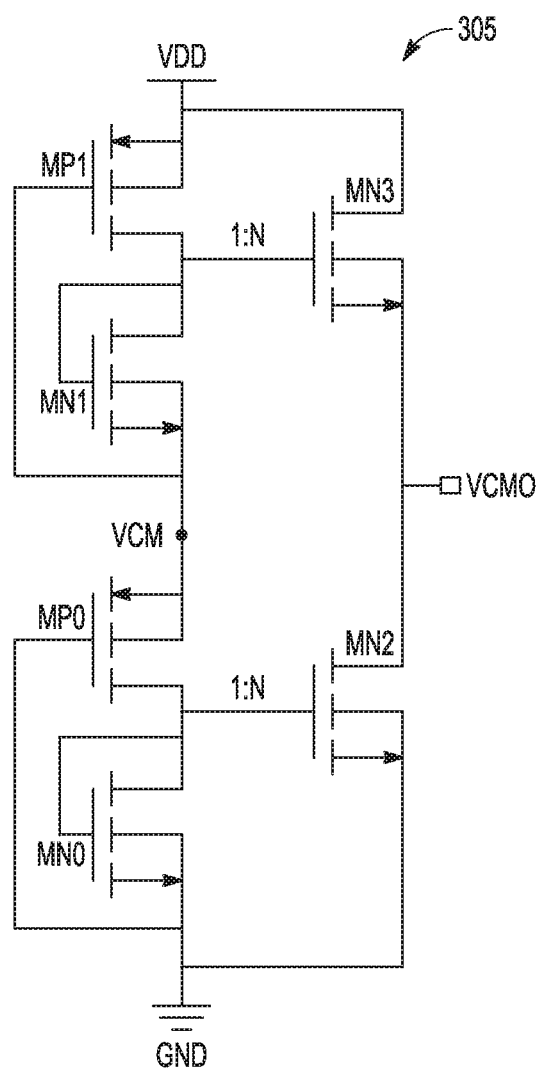
FIG. 3 is a circuit diagram of a common mode reference circuit in another aspect.

FIG. 3 is a circuit diagram of another example of a common mode reference circuit 305. The topology of the circuit is similar to the example of FIG. 2, but in this example the PFETs are the long devices and the NFETs are the wide devices so that $$W_{MN0}=W_{MN1}, L_{MN0}=L_{MN1}$$

$$W_{MP0}=W_{MP1}, L_{MP0}=L_{MP1}$$

$$(W/L)_{MN0/1} >> (W/L)_{MP0/1}.$$

The current in the divider is determined by MP0 and MP1.

Another difference is that the transistors in the output stage are n-channel devices, and they are connected as current mirrors for the NFETs of the divider stage instead of the PFETs. The gate region of MP1 is connected to the source region of MN1, and transistor MN3 is connected as a current mirror to MN1. The gate region of MP0 is connected to the source region of MN0, and transistor MN2 is connected as a current mirror to MN0.

The result is that in the circuit example of FIG. 3 the output stage has strong ability to source current, but a weak ability to sink current. The output stage can recover quickly from a downshoot disturbance, but is slower to recover from an over shoot disturbance.

Figure 4:
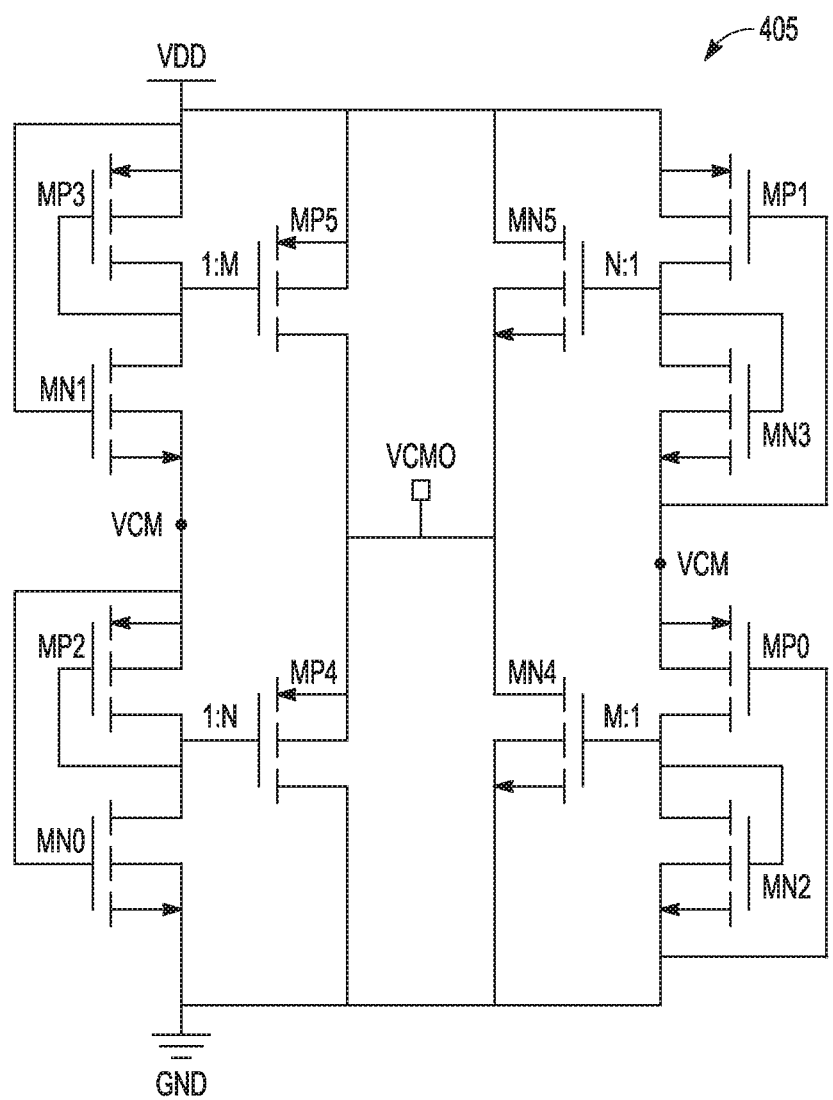
FIG. 4 is a circuit diagram of a common mode reference circuit in another aspect.

FIG. 4 is a circuit diagram of another example of a common mode reference circuit 405. This circuit combines the approaches of FIGS. 2 and 3. The common mode reference circuit of FIG. 4 includes a divider stage and a push-pull output stage. The divider stage includes a first NFET/PFET pair (MP3/MN1) connected the same as transistor pair MP1/MN1 in FIG. 2, and a second NFET/PFET pair (MP2/MN0) connected the same as transistor pair MP0/MN0 of FIG. 2. The divider stage includes a third NFET/PFET pair (MP1/MN3) connected the same as transistor pair MP1/MN1 in FIG. 3, and a second NFET/PFET pair (MP0/MN2) connected the same as transistor pair MP0/MN0 of FIG. 3. Thus the divider stage of FIG. 4 combines the divider stages of FIGS. 2 and 3.

The output stage includes four FETs: PFETs MP4 and MP5, and NFETs MN4 and MN5. As in the output stage of FIG. 2, transistor MP5 is connected as a current mirror of MP3, and transistor MP4 is connected as a current mirror of MP2. As in the output stage of FIG. 3, transistor MN5 is connected as a current mirror of MN3 and transistor MN4 is connected as a current mirror of MN2. Thus, the output stage of FIG. 4 combines the output stages of FIGS. 2 and 3. The output stage in FIG. 4 is a push-pull architecture because MN5 and MP4 provide strong driving ability to both source and sink current. The mirror device ratios (1:M) and (1:N) in FIG. 4 do not need to be equal. M can be smaller than N (M≤N) such as to reduce power consumed by the common mode reference circuit.

The circuit architecture of FIG. 4 is very simple and is self-biased in that no additional bias current needed. The output stage provides a fast settling time due to the strong sinking/sourcing ability. The circuit is stable no matter what the capacitance of the load.

Figure 5A:
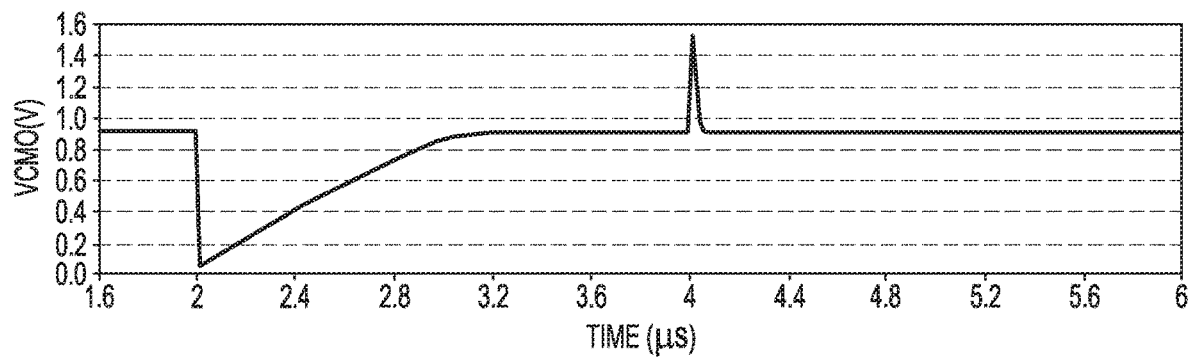
FIGS. 5A-5C show simulations of the transient response of the circuits of FIGS. 2-4.
Figure 5B:
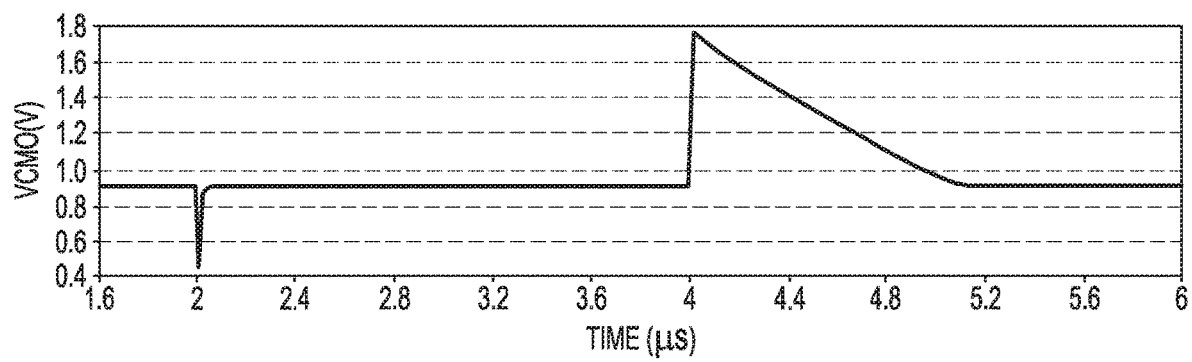
Figure 5C:
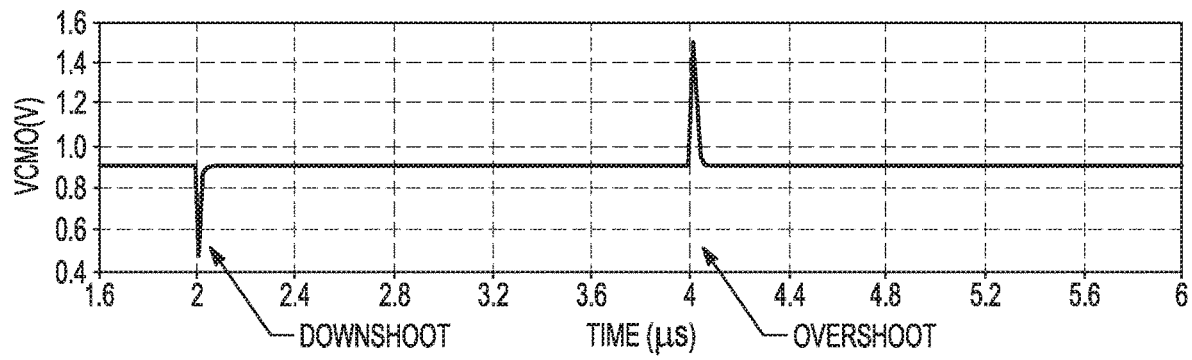

FIGS. 5A-5C show the simulations of the transient response of VCMO of the circuits of FIGS. 2-4. In the simulation, VDD is 1.8V and the current mirror ratio 1:N is set to 1:4. The capacitance load is 2 pico-farads (2 pF) and a 0.9V step applied on the load capacitor. The simulation in FIG. 5A is for the circuit of FIG. 2 and shows a slow response to a downward 0.9V step disturbance and a fast response to the upward 0.9V step disturbance. The simulation of FIG. 5B is for the circuit of FIG. 3 and shows a fast response to a downward 0.9V step disturbance and a slow response to the upward 0.9V step disturbance. The simulation of FIG. 5C is for the circuit of FIG. 4 and shows a fast response for both the downward and upward step disturbances.

Figure 1:
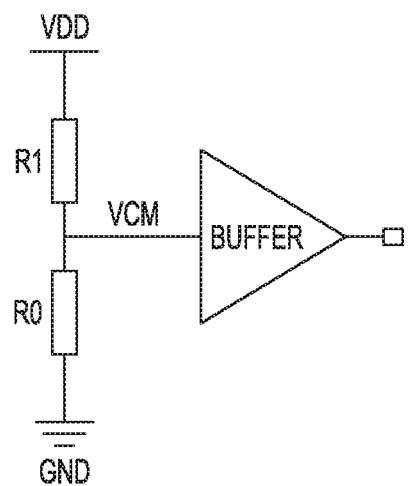
FIG. 1 is a circuit diagram of a common mode reference circuit in an aspect.

The examples of FIGS. 2 and 3 only consume 1.6 microamperes (1.6 uA) of current because the circuit examples only include one leg for an output stage. The example of FIG. 4 settles to 0.1% accuracy (good enough for a common mode voltage reference) in around 200 nS. It has an extra circuit leg in each of the divider stage and the output stage compared to the circuits of FIGS. 2 and 3, but can save more than 80% of power compared to the method in FIG. 1 of using a unity gain buffer. The circuits of FIGS. 2-4 can be easily scaled down for an ultralow power application.

Figure 6:
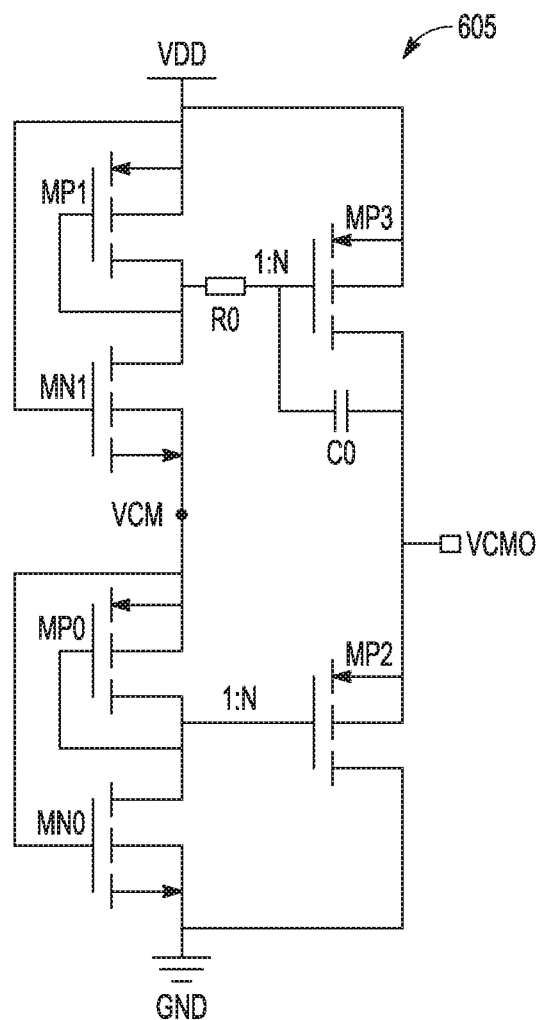
FIG. 6 is a circuit diagram of a common mode reference circuit in another aspect.

FIG. 6 is a circuit diagram of another example of a common mode reference circuit 605. FIG. 6 is similar to the circuit of the example of FIG. 2 but with a resistive circuit element R0 and a capacitor C0 added. The resistive circuit element R0 can include a resistor or an FET biased to behave as an active resistor, and is connected between the drain region of MP1 and the gate region of MP3. Using an FET connected as an active resistor can reduce the overall circuit area over using a passive resistor. Capacitor C0 is connected to R0 and to the gate region of MP3. Capacitor C0 is also connected to the output VCMO at the series connection between MP3 and MP2.

In the circuit of FIG. 6, when there is downshoot disturbance from the load capacitance, the kick back through C0 will decrease the gate voltage of MP3 to boost the transient current through MP3. R0 isolates MP3 and MP1 so that for a fast pulse disturbance, the MP3 current will be boosted for a short while (in relation to RC time constant of R0 and C0) to bring VCMO back close to the desired value of the common mode reference voltage.

Figure 7:
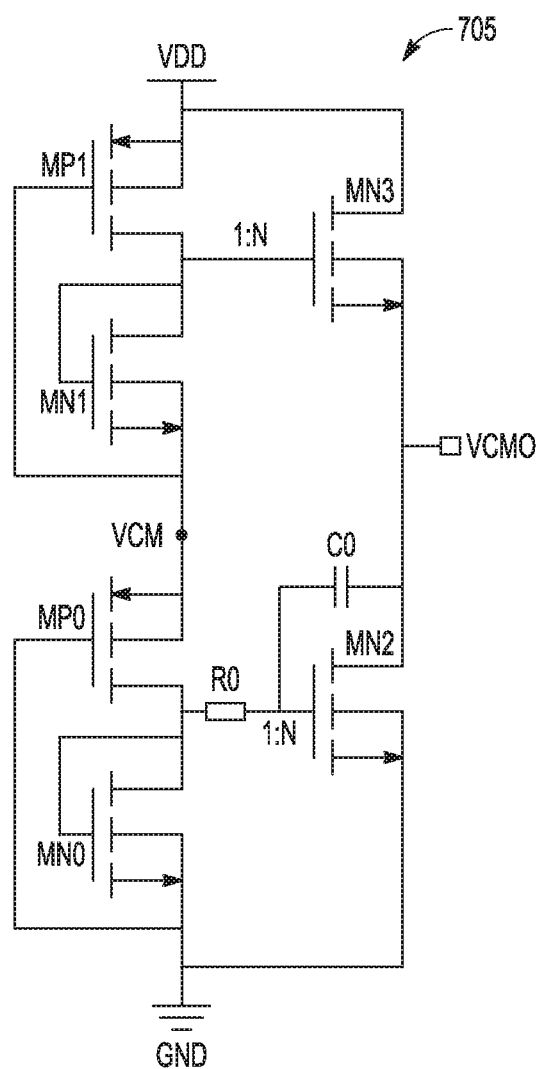
FIG. 7 is a circuit diagram of a common mode reference circuit in another aspect.

FIG. 7 is a circuit diagram of another example of a common mode reference circuit 705. FIG. 7 is similar to the circuit of the example of FIG. 3, but with a resistive circuit element R0 connected between the drain region of MP0 and the gate region of MN2, and a capacitor C0 connected to R0 and to the gate region of MN2. Capacitor C0 is also connected to the output VCMO at the series connection between MN3 and MN2. R0 and C0 are added at the bottom side of the circuit of FIG. 3 so that the response to overshoot is improved in a manner analogous to that explained in regard to the example of FIG. 6.

Figure 8:
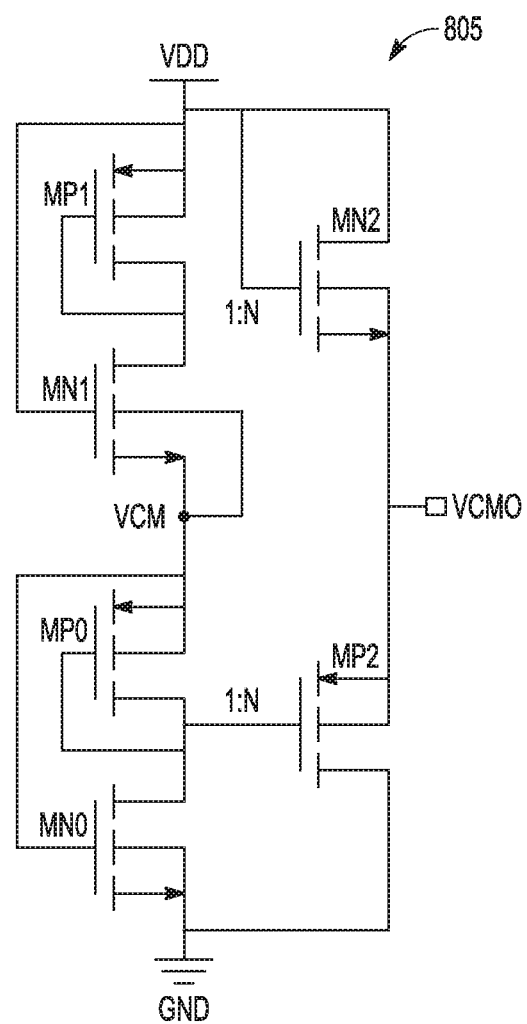
FIG. 8 is a circuit diagram of a common mode reference circuit in another aspect.

Other alternatives to, or variations on, the common mode reference circuits of FIGS. 2-4 can be used. FIG. 8 is a circuit diagram of another example of a common mode reference circuit 805. The example of FIG. 8 is similar to the circuit of FIG. 2 except that the PFET MP3 of the output stage of FIG. 2 is replaced with NFET MN2. Transistor MN2 is connected as a mirror device of MN1, or $$(W/L)_{MN2}:(W/L)_{MN1}=N.$$

Transistor MP2 is still connected as a current mirror of MP0. Compared to the circuit of FIG. 2, the output stage of FIG. 8 provides a stronger ability to source current. While the width-to-length ration (W/L) may be smaller for the NFET MN2 compared to W/L for PFET MP2, the current sinking ability of the output stage is still stronger than its current sourcing ability.

Figure 9:
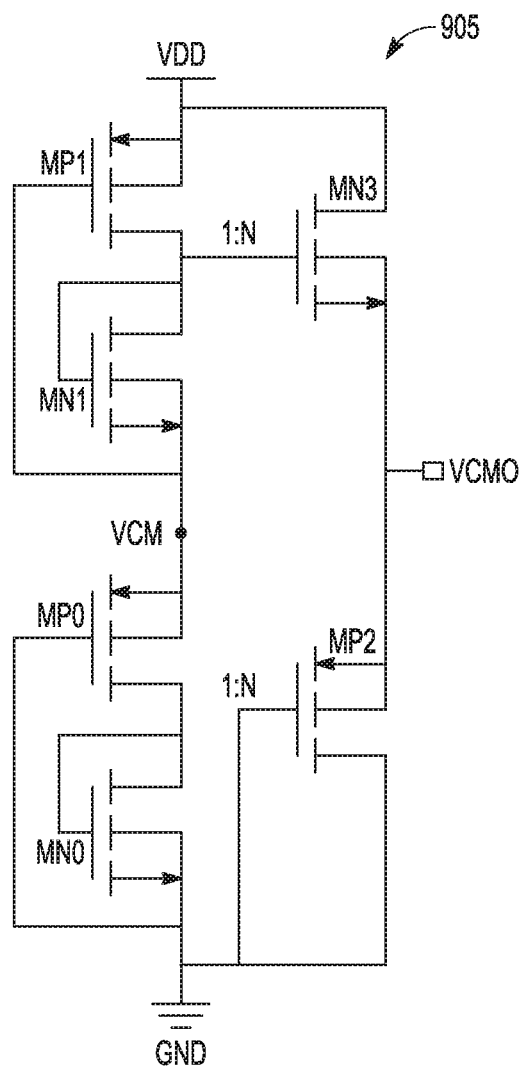
FIG. 9 is a circuit diagram of a common mode reference circuit in another aspect.

FIG. 9 is a circuit diagram of another example of a common mode reference circuit 905. The example of FIG. 9 is similar to the circuit of FIG. 3 except that NFET MN2 of FIG. 3 is replaced with PFET MP2. Transistor MP2 is connected as a current mirror of MP0, and transistor MN3 is still connected as a current mirror of MN1. Compared to the circuit of FIG. 3, the output stage of FIG. 9 provides a stronger sourcing ability and relatively lower sinking ability.

Figure 10:
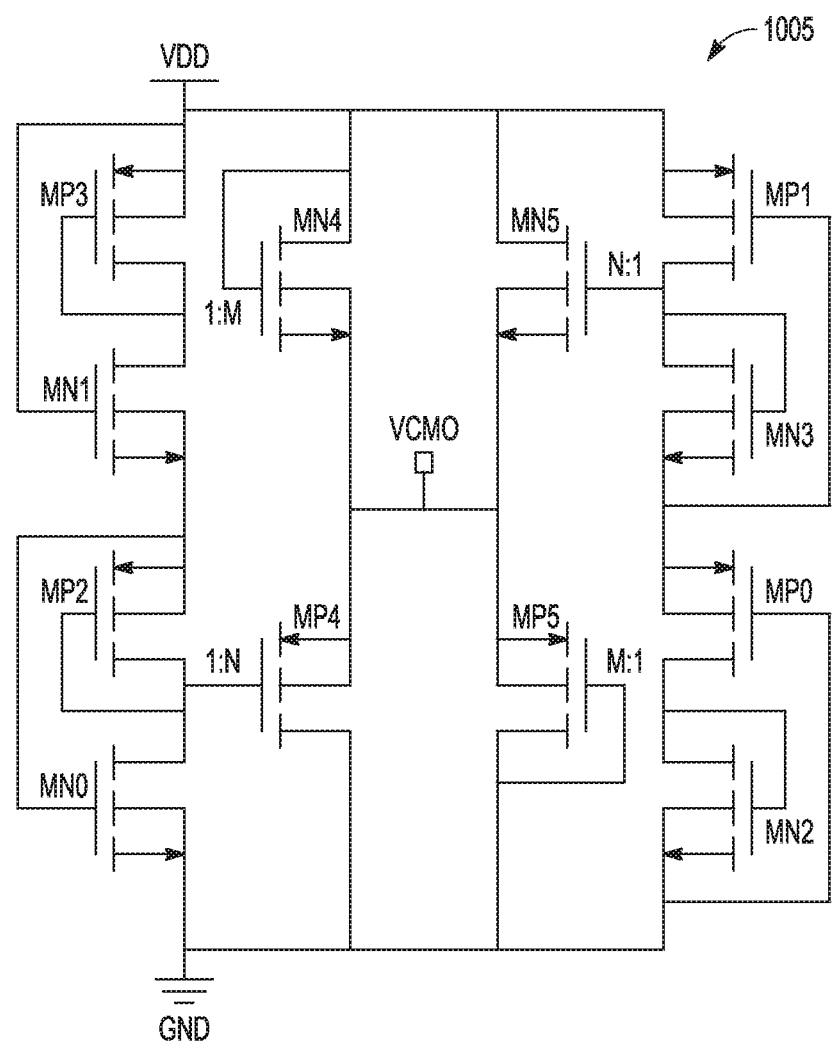
FIG. 10 is a circuit diagram of a common mode reference circuit in another aspect.

FIG. 10 is a circuit diagram of another example of a common mode reference circuit 1005. The circuit of FIG. 10 combines the circuits of FIGS. 8 and 9. The divider stage includes transistors MP3, MN1, MP2, and MN0, corresponding to MP1, MN1, MP0, and MN0 of FIG. 8, respectively, and includes MP1, MN3, MP0, and MN2, which correspond to MP1, MN1, MP0, and MN0 of FIG. 9, respectively. The circuit of FIG. 10 combines the output stages of FIGS. 8 and 9 into one strong push-pull output stage. In FIG. 10, output stage transistors MN4 and MP4 correspond to transistors MN2 and MP2, of FIG. 8, and output stage transistors MN5 and MP5 correspond to transistors MN3 and MP2 of FIG. 9. As in the example of FIG. 4, the mirror device ratios (1:M) and (1:N) in FIG. 10 can be equal but do not need to be equal. M can be less than or equal to N (M≤N) such as to reduce power consumed by the common mode reference circuit.

Figure 11:
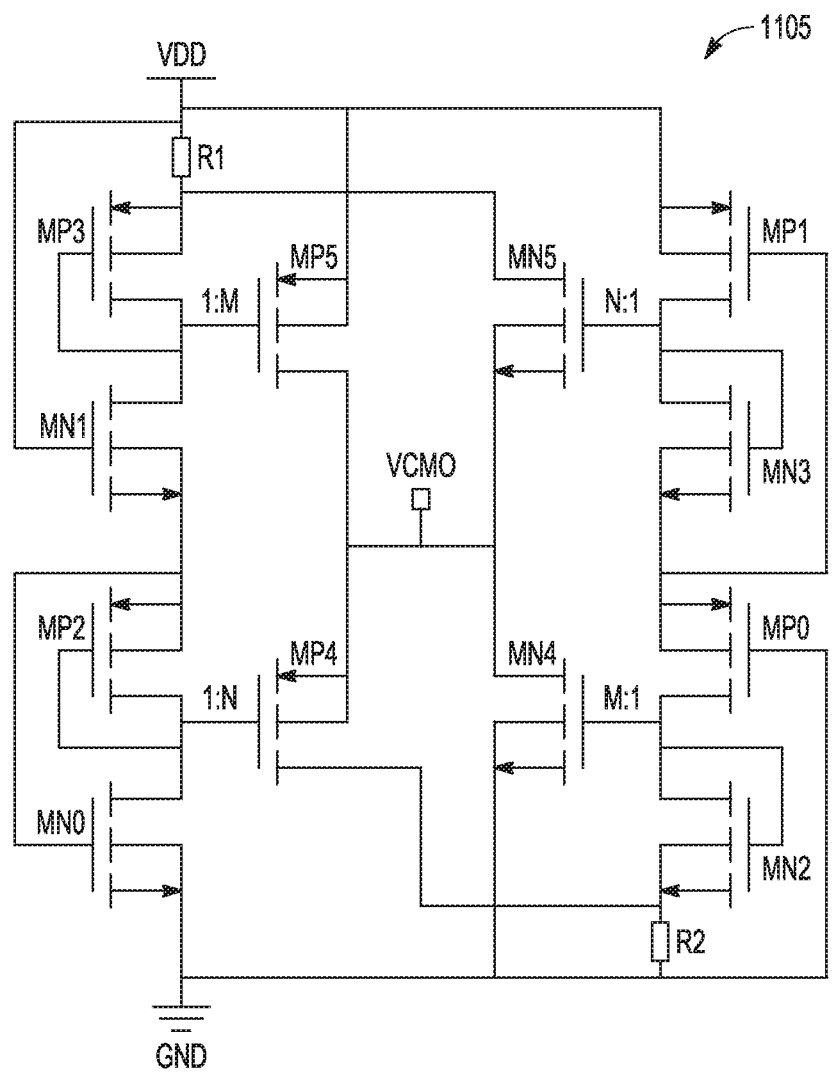
FIG. 11 is a circuit diagram of a common mode reference circuit in another aspect.

FIG. 11 is a circuit diagram of another example of a common mode reference circuit 1105. The circuit of FIG. 11 is similar to the example of FIG. 4 except that the circuit of FIG. 11 includes a first resistive circuit element R1 arranged between MP3 and the high supply voltage circuit node, and a second resistive circuit element R2 arranged between MN2 and the low supply voltage circuit node. R1 helps boost load regulation (or driving capability) by boosting Vgs of MP5 when the output stage is sourcing current (e.g., from VDD to VCMO). R2 helps boost load regulation by boosting Vgs of MN4 when the output stage is sinking current (e.g., from VCMO to GND).

Figure 12:
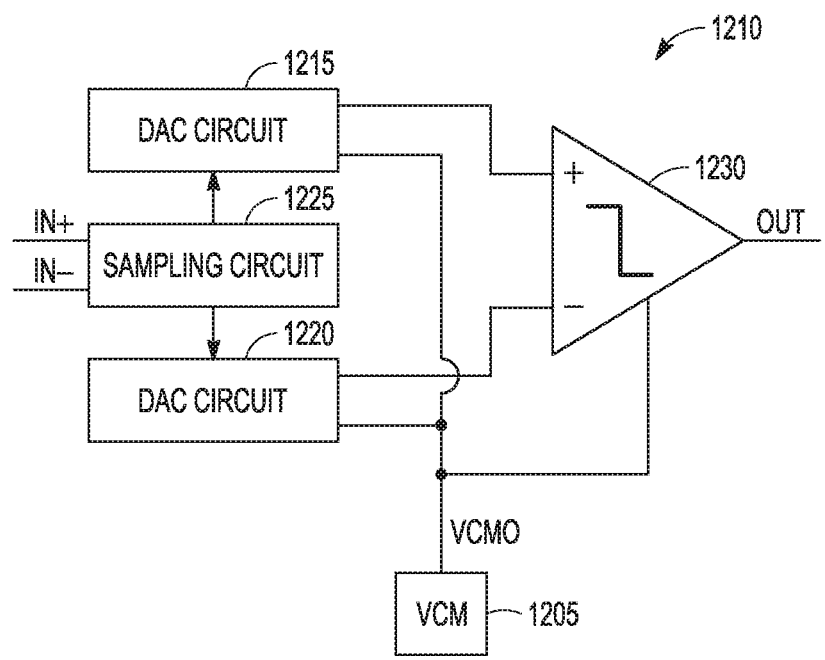
FIG. 12 is a block diagram of an electronic circuit that includes a common reference circuit in an aspect.

FIG. 12 is a block diagram of an electronic circuit that includes a common mode reference circuit 1205 and an ADC circuit 1210. The ADC circuit 1210 is a successive approximation (SAR) ADC circuit and includes a first digital-to-analog converter (DAC) circuit 1215, a second DAC circuit 1220, a sampling circuit 1225, and a comparator circuit 1230. Each DAC includes weighted bit capacitors.

A differential analog input voltage (IN+, IN−) is sampled onto the bit capacitors with respect to the common mode VCMO using the sampling circuit 1225. As part of the successive approximation routine, bit trials for each of the weighted capacitors are performed iteratively. In a bit trial, the output of the first or positive DAC circuit and the output of the negative or second DAC circuit are applied to the inputs of the comparator circuit 1230. Based on the output of the comparator circuit, a bit of the conversion is determined. Conversion then proceeds to weighted capacitor until all bits of the digital value are determined. The common mode reference circuit 1205 provides for recovery after a disturbance of transferring charge to one or more of the weighted capacitors.

Figure 13:
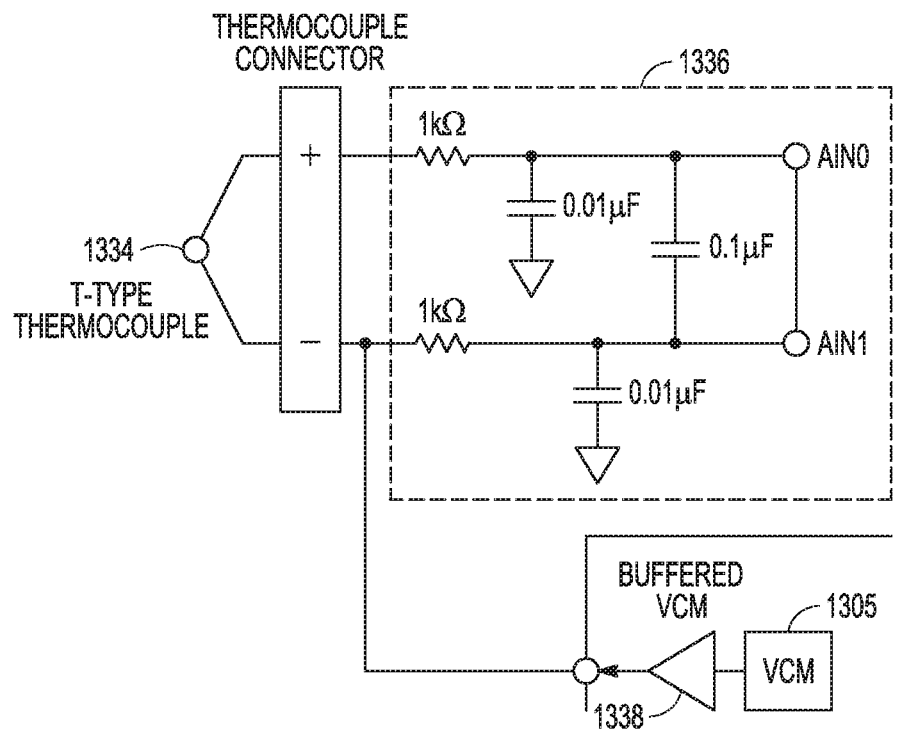
FIG. 13 is a diagram of a circuit that includes a common reference circuit in an aspect.

FIG. 13 is a diagram of a circuit including a common mode reference circuit 1305, an electronic sensor 1334, and a sensor interface circuit 1336. The sensor 1345 in the example of FIG. 13 is a thermocouple. In other examples, the sensor may be an electro-chemical sensor or a gas sensor.

The common mode reference circuit 1305 can be any of the common reference mode circuits described herein. The output of the common mode reference circuit 1305 may be buffered using buffer circuit 1338 to drive the VCM signal external to an integrated circuit. The VCM signal is output to a circuit node of the sensor interface circuit 1336 for common biasing of the sensor output. The sensor interface circuit 1336 can include a high voltage supply and a low voltage supply. The output of the common mode reference circuit 1305 (VCMO) can be a voltage midway between the high voltage supply and the low voltage supply (e.g., VDD/2).

Figure 14:
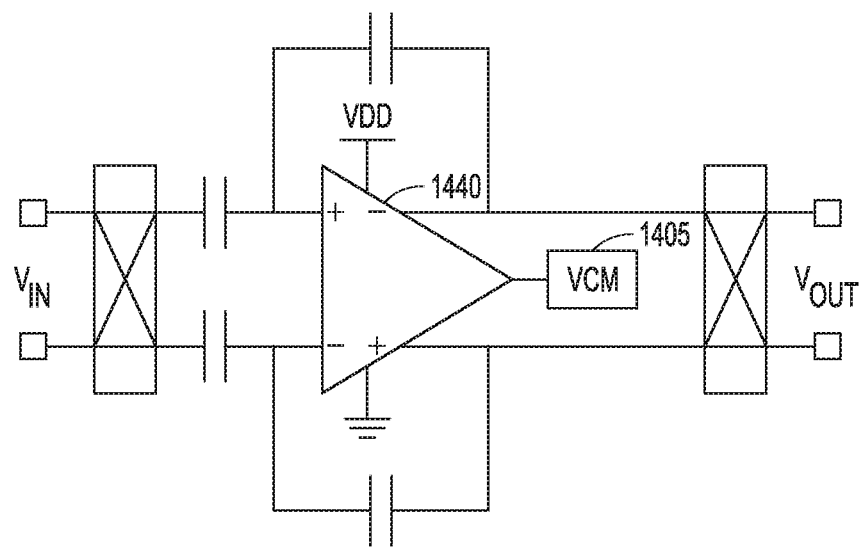
FIG. 14 is a diagram of a circuit that includes a common reference circuit in another aspect.

FIG. 14 is a diagram of a circuit including a common mode reference circuit 1405 and a differential amplifier 1440. The common mode reference circuit 1405 is coupled to a common mode input of the differential amplifier and sets the differential amplifier output common mode voltage. The output of the common mode reference circuit 1405 can be a voltage midway between the high voltage supply and the low voltage supply of the differential amplifier 1440.

Figure 15:
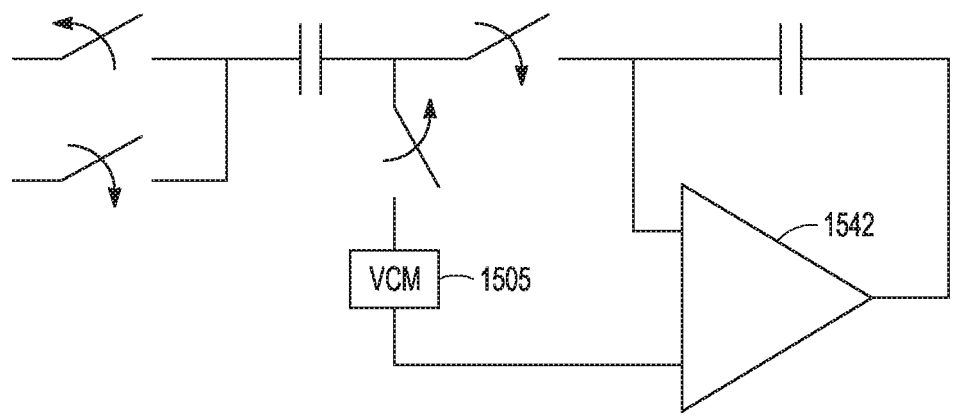
FIG. 15 is a diagram of a circuit that includes a common reference circuit in another aspect.
Figure 16:
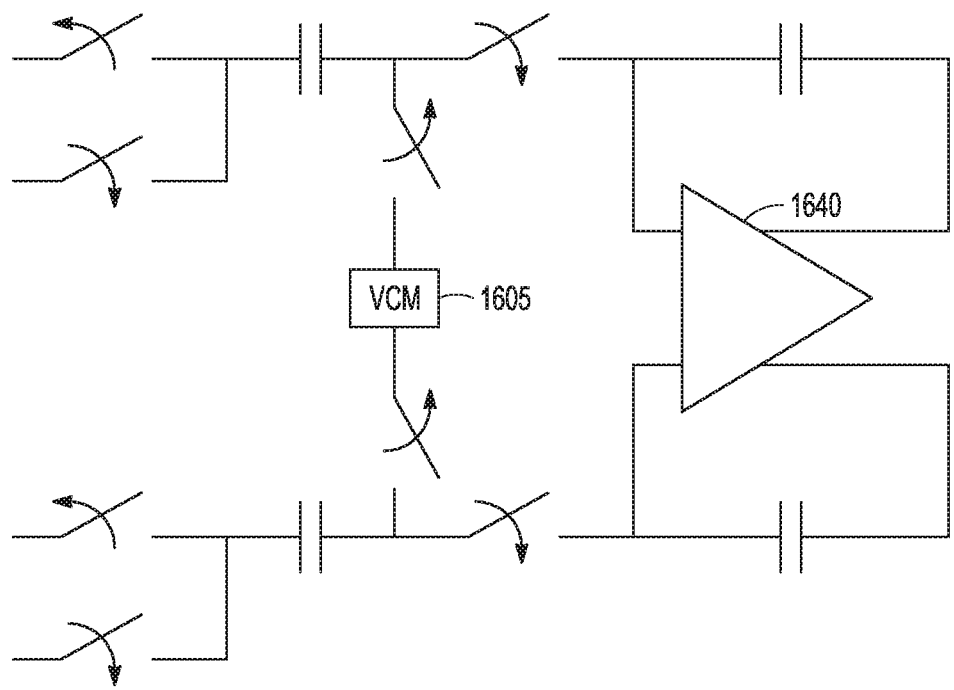
FIG. 16 is a diagram of a circuit that includes a common reference circuit in another aspect.

FIGS. 15 and 16 are circuit diagrams of examples of switched capacitor circuits. FIG. 15 is a single ended circuit that includes a common mode reference circuit 1505 and an amplifier 1542. Switching the capacitors provides the biasing to the amplifier. FIG. 16 is fully differential circuit that includes a common mode reference circuit 1605 and a differential amplifier 1640. In the examples of FIGS. 15 and 16, the output of the common mode reference circuit can be used as virtual ground in the switched capacitor circuits.

The common mode reference circuits described herein can be used with any differential circuit or single ended circuit in which a common reference is desired (e.g., ADC circuits of other topologies, differential amplifiers, integrator circuits, etc.). The common mode reference circuits can be used in ultralow power applications, and provide circuit stability for capacitive loads.

ADDITIONAL DESCRIPTION AND ASPECTS

Aspect 1 can include subject matter (such as a common mode reference circuit) comprising a divider stage and an output stage. The divider stage includes a first n-channel field effect transistor and p-channel field effect transistor (NFET/PFET) pair connected in series to a high supply voltage circuit node; and a second NFET/PFET pair connected in series to a low supply voltage circuit node. The output stage includes a first field effect transistor (FET) connected as a current mirror to a transistor of the first NFET/PFET pair; a second FET connected as a current mirror to a transistor of the second NFET/PFET pair; and a common mode reference output at a series connection from the first FET of the output stage to the second FET of the output stage.

In Aspect 2, the subject flatter of Aspect 1 optionally includes the first and second FETs of the output stage being both PFETs; wherein a gate region of the NFET of the first NFET/PFET pair is connected to a source region of the PFET of the first NFET/PFET pair, and the first FET of the output stage is connected as a current mirror to the PFET of the first NFET/PFET pair; and wherein a gate region of the NFET of the second NFET/PFET pair is connected to a source region of the PFET of the second NFET/PFET pair, and the second FET of the output stage is connected as a current mirror to the PFET of the second NFET/PFET transistor pair.

In Aspect 3, the subject matter of one or both of Aspects 1 and 2 optionally includes a resistive circuit element coupled between a drain region of the PFET of the first NFET/PFET pair and a gate region of the first YET of the output stage; and a capacitor coupled to the resistive circuit element and coupled between the gate region of the first FET of the output stage and the series connection from the first FET to the second FET.

In Aspect 4, the subject matter of one or both of Aspects 1 and 3 optionally includes the first and second FETs of the output stage being both NFETs; wherein a gate region of the PFET of the first NFET/PFET pair is connected to a source region of the NFET of the first NFET/PFET pair, and the first FET of the output stage is connected as a current mirror to the NFET of the first NFET/PFET pair; and wherein a gate region of the PFET of the second NFET/PFET pair is connected to the source region of the NFET of the second NFET/PFET pair, and the second FET of the output stage is connected as a current mirror to the NFET of the second NFET/PFET pair.

In Aspect 5, the subject matter of one or both of Aspects 1 and 4 optionally includes a resistive circuit element coupled between a drain region of the PFET of the second NFET/PFET pair and a gate region of the second MT of the output stage; and a capacitor coupled to the resistive circuit element and coupled between the gate region of the second FET of the output stage and the series connection from the first FET to the second FET.

In Aspect 6, the subject matter of Aspect 1 optionally includes the first and second FETs of the output stage being an NFET and a PFET, respectively; wherein a gate region of the NFET of the first NFET/PFET pair is connected to a source region of the PFET of the NFET/PFET pair, and the first FET of the output stage is connected as current mirror to the NFET of the first NFET/PFET pair; and wherein a gate region of the NFET of the second NFET/PFET pair is connected to the source region of the PFET of the second NFET/PFET pair, and the second FET of the output stage is connected as a current mirror to the PFET of the second NFET/PFET pair.

In Aspect 7, the subject matter of Aspect 1 optionally includes the first and second FETs of the output stage being an NFET and a PFET, respectively; wherein a gate region of the PFET of the first NFET/PFET pair is connected to a source region of the NFET of the first NFET/PFET pair, and the first FET of the output stage is connected as a current mirror to the NFET of the first NFET/PFET pair; wherein a gate region of the PFET of the second NFET/PFET pair is connected to a source region of the NFET of the second NFET/PFET pair, and the second FET of the output stage is connected as a current mirror to the PFET of the second NFET/PFET pair.

In Aspect 8, the subject matter of one or any combination of Aspects 1-3 optionally includes a divider stage further including: a third NFET/PFET pair connected in series to the high supply voltage circuit node; and a fourth NFET/PFET pair connected in series to the low supply voltage circuit node; and wherein the output stage further includes: a third FET connected as a current mirror to a transistor of the third NFET/PFET pair; and a fourth FET connected in series with the third FET and connected as current mirror to a transistor of the fourth NFET/PFET pair, wherein the series connection of the third FET and the fourth FET is connected to the common mode reference output.

In Aspect 9, the subject matter of Aspect 8 optionally includes the first and second FETs of the output stage being both PFETs, and the third and fourth FETs of the output stage are both NFETs; wherein a gate region of the NFET of the first NFET/PFET pair is connected to the source region of the PFET of the first NFET/PFET pair, and the first FET of the output stage is connected as a current mirror to the PFET of the first NFET/PFET pair; wherein a gate region of the NFET of the second NFET/PFET pair is connected to the source region of the PFET of the second NFET/PFET pair, and the second FET of the output stage is connected as a current mirror to the PFET of the second NFET/PFET pair; wherein a gate region of the PFET of the third NFET/PFET pair is connected to a source region of the NFET of the third NFET/PFET pair, and the third FET of the output stage is connected as a current mirror to the NFET of the third NFET/PFET pair; and wherein a gate region of the PFET of the fourth NFET/PFET pair is connected to the source region of the NFET of the fourth NFET/PFET pair, and the fourth FET is connected as a current mirror to the NFET of the fourth NFET/PFET pair.

In Aspect 10, the subject matter of Aspect 8 optionally includes a first resistive circuit element arranged between the PFET of the first NFET/PFET pair and the high supply voltage circuit node; and a second resistive circuit element coupled between the NFET of the fourth NFET/PFET pair and the low supply voltage circuit node.

In Aspect 11, the subject matter of Aspect 8 optionally includes the first and third FETs of the output stage being both NFETs, and the second and fourth FETs of the output stage are both PFETs; wherein a gate region of the NFET of the first NFET/PFET pair is connected to a source region of the PFET of the NFET/PFET pair, and the first FET of the output stage is connected as current mirror to the NFET of the first NFET/PFET pair; and wherein a gate region of the NEFF of the second NFET/PFET pair is connected to the source region of the PFET of the second NFET/PFET pair, and the second FET of the output stage is connected as a current mirror to the PFET of the second NET/PFET pair; wherein a gate region of the PFET of the third NFET/PFET pair is connected to the source region of the NFET of the third NFET/PFET pair, and the third of the output stage is connected as a current mirror to the NFET of the third NFET/PFET pair; wherein a gate region of the PFET of the fourth NFET/PFET pair is connected to a source region of the NFET of the fourth NFET/PFET pair, and the fourth FET of the output stage is connected as a current mirror to the PFET of the fourth NFET/PFET pair.

Aspect 12 includes subject matter (such as an electronic circuit), or can optionally be combined with one or any combination of Examples 1-11 to include such subject matter, comprising: a common mode reference circuit including: a divider stage including: a first transistor pair connected in series to a high supply voltage rail; a second transistor pair connected in series to the first transistor pair and a low supply voltage rail; a third transistor pair connected in series to the high supply voltage rail; and a fourth transistor pair connected in series to the third transistor pair and the low supply voltage rail; and a push-pull output stage connected to the first and second divider stages and including a common mode reference output.

In Aspect 13, the subject matter of Aspect 12 optionally includes a push-pull output stage including a first field effect transistor (FET) connected as a current mirror to a transistor of the first transistor pair; a second FET connected as a current mirror to a transistor of the second transistor pair and connected in series with the first FET; a third FET connected as a current mirror to a transistor of the third transistor pair; a fourth FET connected as a current mirror to a transistor of the fourth transistor pair and connected in series with the third FET; and wherein the common mode reference output is connected to a source region or drain region of each of the first, second, third, and fourth FETs.

In Aspect 14, the subject matter of Aspect 13 optionally includes each of the first, second, third, and fourth transistor pairs of the divider stage being n-channel field effect transistor and p-channel field effect transistor (NFET/PFET) pairs; wherein the first FEE of the output stage is a PFET connected as a current mirror to the PFET of the first transistor pair; wherein the second FET of the output stage is a PFET connected as a current mirror to the PFET of the second transistor pair; wherein the third ITT of the output stage is an NFET connected as a current mirror to the NFET of the third transistor pair; and wherein the fourth FET of the output stage is an NFET connected as a current mirror to the NFET of the fourth transistor pair.

In Aspect 15, the subject matter of Aspect 14 optionally includes a first resistive circuit element arranged between the PFET of the first NFET/PFET pair and the high supply voltage circuit node; and a second resistive circuit element coupled between the NFET of the fourth NFET/PFET pair and the low supply voltage circuit node.

In Aspect 16, the subject matter of Aspect 15 optionally includes each of the first, second, third, and fourth transistor pairs of the divider stage are n-channel field effect transistor and p-channel field effect transistor (NFET/PFET) pairs; wherein the first FET of the output stage is an NFET connected as a current mirror to the NFET of the first transistor pair; wherein the second FET of the output stage is a PFET connected as a current mirror to the PITT of the second transistor pair; wherein the third FET of the output stage is an NFET connected as a current mirror to the NFET of the third transistor pair; and wherein the fourth FET of the output stage is a PFET connected as a current mirror to a PFET of the fourth transistor pair.

In Aspect 17, the subject matter of one or any combination of Aspects 12-16 optionally includes an electronic sensor and sensor interface circuit, wherein the sensor interface circuit includes a common mode circuit node and the common mode reference output is coupled to the common mode circuit node of the sensor interface circuit.

Aspect 18 can include subject matter (such as an electronic circuit), or can optionally be combined one or any combination of Example 1-17 to include such subject matter, comprising a common mode reference circuit, and amplifier circuit, and a switched capacitor circuit. The common mode reference circuit includes a divider stage and an output stage. The divider stage includes: a first n-channel field effect transistor and p-channel field effect transistor (NFET/PFET) pair connected in series to a high supply voltage rail; and a second NFET/PFET pair connected in series to a low supply voltage rail. The output stage includes: a first FET connected as a current mirror to a transistor of the first NFET/PFET pair; a second FET connected as a current mirror to a transistor of the second NFET/PFET pair; and a common mode reference output at a series connection from the first FET to the second FET. The switched capacitor circuit can be coupled to the common mode reference circuit and the amplifier circuit, wherein the output of the common mode reference circuit is a virtual ground for the switched capacitor circuit.

In Aspect 19, the subject matter of Aspect 18 can optionally include the first and second FETs of the output stage being both PFETs; wherein a gate region of the NFET of the first NFET/PFET pair is connected to the source region of the PFET of the first NFET/PFET pair, and the first FET of the output stage is connected as a current mirror to the PFET of the first NFET/PFET pair; and wherein a gate region of the NFET of the second NFET/PFET pair is connected to the source region of the PFET of the second NFET/PFET pair, and the second FET of the output stage is connected as a current mirror to the PFET of the second NFET/PFET pair.

In Aspect 20, the subject matter of one or both of Aspects 18 and 19 optionally includes a resistive circuit element coupled between a drain region of the PFET of the first NFET/PFET pair and a gate region of the first FET of the output stage; and a capacitor coupled to the resistive circuit element and coupled between the gate region of the first FET of the output stage and the series connection from the first FET to the second FET.

In Aspect 21, the subject matter of Aspect 18 optionally includes the first and second FETs of the output stage being both NFETs; wherein a gate region of the PFET of the first NFET/PFET pair is connected to a source region of the NFET of the first NFET/PFET pair, and the first FET of the output stage is connected as a current mirror to the NFET of the first NFET/PFET pair; and wherein a gate region of the PFET of the second NFET/PFET pair is connected to the source region of the NFET of the second NFET/PFET pair, and the second FET of the output stage is connected as a current mirror to the NFET of the second NFET/PFET pair.

In Aspect 22, the subject matter of Aspect 18 optionally includes a resistive circuit element coupled between a drain region of the PFET of the second NFET/PFET pair and a gate region of the second FET of the output stage; and a capacitor coupled to the resistive circuit element and coupled between the gate region of the second FET of the output stage and the series connection from the first FET to the second FET.

In Aspect 23, the subject matter of Aspect 18 optionally includes a divider stage including a third NFET/PFET pair connected in series to the high supply voltage circuit node; and a fourth NFET/PFET pair connected in series to the low supply voltage circuit node. The output stage optionally includes: a third FET connected as a current mirror to a transistor of the third NFET/PFET pair; and a fourth FET connected in series with the third FET and connected as current mirror to a transistor of the fourth NFET/PFET pair, wherein the series connection of the third FET and the fourth FET is connected to the common mode reference output.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A common mode reference circuit comprising:
  a divider stage including:
    a first n-channel field effect transistor and p-channel field effect transistor (NFET/PFET) pair connected in series to a high supply voltage circuit node;
    a second NFET/PFET pair connected in series to the first NFET/PFET pair and a low supply voltage circuit node;
    a third NFET/PFET pair connected in series to the high supply voltage circuit node; and
    a fourth NFET/PFET pair connected in series to the low supply voltage circuit node; and
  an output stage including:
    a first field effect transistor (FET) connected as a current mirror to a transistor of the first NFET/PFET pair;
    a second FET connected as a current mirror to a transistor of the second NFET/PFET pair;
    a third FET connected as a current mirror to a transistor of the third NFET/PFET pair;
    a fourth FET connected as a current mirror to a transistor of the fourth NFET/PFET pair; and
    a common mode reference output connected to a series connection from the first FET to the second FET of the output stage and to a series connection from the third FET to the fourth FET of the output stage.

2. The common mode reference circuit of claim 1,
  wherein the first and second FETs of the output stage are both PFETs;
  wherein a gate region of the NFET of the first NFET/PFET pair is connected to a source region of the PFET of the first NFET/PFET pair, and the first FET of the output stage is connected as a current mirror to the PFET of the first NFET/PFET pair; and
  wherein a gate region of the NFET of the second NFET/PFET pair is connected to a source region of the PFET of the second NFET/PFET pair, and the second FET of the output stage is connected as a current mirror to the PFET of the second NFET/PFET transistor pair.

3. The common mode reference circuit of claim 1, including a resistive circuit element coupled between a drain region of the PFET of the first NFET/PFET pair and a gate region of the first FET of the output stage; and a capacitor coupled to the resistive circuit element and coupled between the gate region of the first FET of the output stage and the series connection from the first FET to the second FET.

4. The common mode reference circuit of claim 1,
wherein the first and second FETs of the output stage are both NFETs;
wherein a gate region of the PFET of the first NFET/PFET pair is connected to a source region of the NFET of the first NFET/PFET pair, and the first FET of the output stage is connected as a current mirror to the NFET of the first NFET/PFET pair; and
wherein a gate region of the PFET of the second NFET/PFET pair is connected to a source region of the NFET of the second NFET/PFET pair, and the second FET of the output stage is connected as a current mirror to the NFET of the second NFET/PFET pair.

5. The common mode reference circuit of claim 1, including a resistive circuit element coupled between a drain region of the PFET of the second NFET/PFET pair and a gate region of the second FET of the output stage; and a capacitor coupled to the resistive circuit element and coupled between the gate region of the second FET of the output stage and the series connection from the first FET to the second FET.

6. The common mode reference circuit of claim 1,
wherein the first and second FETs of the output stage are an NFET and a PFET, respectively;
wherein a gate region of the NFET of the first NFET/PFET pair is connected to a source region of the PFET of the first NFET/PFET pair, and the first of the output stage is connected as current mirror to the NFET of the first NFET/PFET pair; and
wherein a gate region of the NFET of the second NFET/PFET pair is connected to a source region of the PFET of the second NFET/PFET pair, and the second FET of the output stage is connected as a current mirror to the PFET of the second NFET/PFET pair.

7. The common mode reference circuit of claim 1,
wherein the first and second FETs of the output stage are an NFET and a PFET, respectively;
wherein a gate region of the PFET of the first NFET/PFET pair is connected to a source region of the NFET of the first NFET/PFET pair, and the first FET of the output stage is connected as a current mirror to the NFET of the first NFET/PFET pair; and
wherein a gate region of the PFET of the second NFET/PFET pair is connected to a source region of the NFET of the second NFET/PFET pair, and the second FET of the output stage is connected as a current mirror to the PFET of the second NFET/PFET pair.

8. The common mode reference circuit of claim 1,
wherein the first and second FETs of the output stage are both PFETs, and the third and fourth FETs of the output stage are both NFETs;
wherein a gate region of the NFET of the first NFET/PFET pair is connected to a source region of the PFET of the first NFET/PFET pair, and the first of the output stage is connected as a current mirror to the PFET of the first NFET/PFET pair;
wherein a gate region of the NFET of the second NFET/PFET pair is connected to a source region of the PFET of the second NFET/PFET pair, and the second FET of the output stage is connected as a current mirror to the PFET of the second NFET/PFET pair;
wherein a gate region of the PFET of the third NFET/PFET pair is connected to a source region of the NFET of the third NFET/PFET pair, and the third FET of the output stage is connected as a current mirror to the NFET of the third NFET/PFET pair; and
wherein a gate region of the PFET of the fourth NFET/PFET pair is connected to a source region of the NFET of the fourth NFET/PFET pair, and the fourth FET is connected as a current mirror to the NFET of the fourth NFET/PFET pair.

9. The common mode reference circuit of claim 1, including:
a first resistive circuit element arranged between the PFET of the first NFET/PFET pair and the high supply voltage circuit node; and
a second resistive circuit element coupled between the NFET of the fourth NFET/PFET pair and the low supply voltage circuit node.

10. The common mode reference circuit of claim 1,
wherein the first and third FETs of the output stage are both NFETs, and the second and fourth FETs of the output stage are both PFETs;
wherein a gate region of the NFET of the first NFET/PFET pair is connected to a source region of the PFET of the first NFET/PFET pair, and the first FET of the output stage is connected as current mirror to the NFET of the first NFET/PFET pair;
wherein a gate region of the NFET of the second NFET/PFET pair is connected to a source region of the PFET of the second NFET/PFET pair; and the second FET of the output stage is connected as a current mirror to the PFET of the second NFET/PFET pair;
wherein a gate region of the PFET of the third NFET/PFET pair is connected to a source region of the NFET of the third NFET/PFET pair, and the third FET of the output stage is connected as a current mirror to the NFET of the third NFET/PFET pair; and
wherein a gate region of the PFET of the fourth NFET/PFET pair is connected to a source region of the NFET of the fourth NFET/PFET pair, and the fourth FET of the output stage is connected as a current mirror to the PFET of the fourth NFET/PFET pair.

11. An electronic circuit comprising:
a common mode reference circuit including:
a divider stage including:
a first transistor pair connected in series to a high supply voltage rail;
a second transistor pair connected in series to the first transistor pair and a low supply voltage rail:
a third transistor pair connected in series to the high supply voltage rail; and
a fourth transistor pair connected in series to the third transistor pair and the low supply voltage rail; and
a push-pull output stage connected to the divider stage and including:
a first output stage leg coupled to the high supply voltage rail and the low supply voltage rail, the first output stage leg including a first field effect transistor (FET) connected as a current mirror to a transistor of the first transistor pair and a second FET connected as a current mirror to a transistor of the second transistor pair and connected in series with the first FET;
a second output stage leg coupled to the high supply voltage rail and the low supply voltage rail, the second output stage leg including a third FET connected as a current mirror to a transistor of the third transistor pair, and a fourth FET connected as a current mirror to a transistor of the fourth transistor pair and connected in series with the third FET; and a common mode reference output connected to a source region or drain region of each of the first, second, third, and fourth FETs.

12. The electronic circuit of claim 11,
wherein each of the first, second, third, and fourth transistor pairs of the divider stage are n-channel field effect transistor and p-channel field effect transistor (NFET/PFET) pairs;
wherein the first FET of the output stage is a PFET connected as a current mirror to the PFET of the first transistor pair;
wherein the second FET of the output stage is a PFET connected as a current mirror to the PFET of the second transistor pair;
wherein the third FET of the output stage is an NFET connected as a current mirror to the NFET of the third transistor pair; and
wherein the fourth FET of the output stage is an NFET connected as a current mirror to the NFET of the fourth transistor pair.

13. The common mode reference circuit of claim 12, including:
a first resistive circuit element arranged between the PFET of the first NFET/PFET pair and the high supply voltage circuit node; and
a second resistive circuit element coupled between the NFET of the fourth NFET/PFET pair and the low supply voltage circuit node.

14. The electronic circuit of claim 11,
wherein each of the first, second, third, and fourth transistor pairs of the divider stage are n-channel field effect transistor and p-channel field effect transistor (NFET/PFET) pairs;
wherein the first FET of the output stage is an NFET connected as a current mirror to the NFET of the first transistor pair;
wherein the second FET of the output stage is a PFET connected as a current mirror to the PFET of the second transistor pair;
wherein the third FET of the output stage is an NFET connected as a current mirror to the NFET of the third transistor pair; and
wherein the fourth FET of the output stage is a PFET connected as a current mirror to a PFET of the fourth transistor pair.

15. The electronic circuit of claim 11, including an electronic sensor and sensor interface circuit, wherein the sensor interface circuit includes a common mode circuit node and the common mode reference output is coupled to the common mode circuit node of the sensor interface circuit.

16. The electronic circuit of claim 11,
wherein the first transistor pair of the divider stage includes a first n-channel field effect transistor and p-channel field effect transistor (NFET/PFET) pair; and the second transistor pair of the divider stage includes a second NETT/PFET pair; and
wherein the electronic circuit further includes:
an amplifier circuit; and
a switched capacitor circuit coupled to the common mode reference circuit and the amplifier circuit, wherein the output of the common mode reference circuit is a virtual ground for the switched capacitor circuit.

17. The electronic circuit of claim 16,
wherein the first and second FETs of the output stage are both PFETs;
wherein a gate region of the NFET of the first NFET/PFET pair is connected to a source region of the PFET of the first NFET/PFET pair, and the first of the output stage is connected as a current mirror to the PFET of the first NFET/PFET pair; and
wherein a gate region of the NFET of the second NFET/PFET pair is connected to a source region of the PFET of the second NFET/PFET pair; and the second FET of the output stage is connected as a current mirror to the PEST of the second NFET/PFET pair.

18. The electronic circuit of claim 16,
wherein first and second FETs of the output stage are both NFETs;
wherein a gate region of the PFET of the first NFET/PFET pair is connected to a source region of the NFET of the first NFET/PFET pair, and the first FET of the output stage is connected as a current mirror to the NFET of the first NFET/PFET pair; and
wherein a gate region of the PFET of the second NFET/PFET pair is connected to a source region of the NFET of the second NFET/PFET pair, and the second FET of the output stage is connected as a current mirror to the NFET of the second NFET/PFET pair.

19. The electronic circuit of claim 16,
wherein the third transistor pair of the divider stage includes a third NFET/PFET pair connected in series to the high supply voltage circuit node; and the fourth transistor pair of the divider stage includes a fourth NFET/PFET pair connected in series to the low supply voltage circuit node.

20. An electronic circuit comprising:
a common mode reference circuit including:
a divider stage including:
a first n-channel field effect transistor and p-channel field effect transistor (NFET/PFET) pair connected in series to a high supply voltage rail; and
a second NFET/PFET pair connected in series to the first NFET/PFET pair and a low supply voltage rail; and
an output stage including:
a first FET connected as a current mirror to a transistor of the first NFET/PFET pair;
a second FET connected as a current mirror to a transistor of the second NFET/PFET pair; and
a common mode reference output at a series connection from the first FET to the second FET; and
a resistive circuit element coupled between a drain region of the PFET of the first NFET/PFET pair and a gate region of the first FET of the output stage; and
a capacitor coupled to the resistive circuit element and coupled between the gate region of the first FET of the output stage and the series connection from the first FET to the second FET.

21. The electronic circuit of claim 20, wherein the resistive circuit element is coupled between the drain region of the PFET of the second NFET/PFET pair and the gate region of the second FET of the output stage; and the capacitor is coupled to the resistive circuit element and coupled between the gate region of the second FET of the output stage and the series connection from the first FET to the second FET.

* * * * *

UNITED STATES PATENT AND TRADEMARK OFFICE
CERTIFICATE OF CORRECTION

PATENT NO. : 10,613,569 B2  
APPLICATION NO. : 15/951894  
DATED : April 7, 2020  
INVENTOR(S) : Wang et al.

Page 1 of 1

It is certified that error appears in the above-identified patent and that said Letters Patent is hereby corrected as shown below:

In Column 13, Line 36, in Claim 6, after "first", insert --FET--

In Column 13, Line 63, in Claim 8, after "first", insert --FET--

In Column 14, Line 33, in Claim 10, delete "pair;" and insert --pair,-- therefor In Column 14, Line 52, in Claim 11, delete "rail:" and insert --rail;-- therefor In Column 15, Line 62, in Claim 16, delete "NETT/PFET" and insert --NFET/PFET-- therefor In Column 16, Line 8, in Claim 17, after "first", insert --FET--

In Column 16, Line 13, in Claim 17, delete "pair;" and insert --pair,-- therefor In Column 16, Line 15, in Claim 17, delete "PEST" and insert --PFET-- therefor Signed and Sealed this
Fourteenth Day of July, 2020

Andrei Iancu
*Director of the United States Patent and Trademark Office*